United States Patent
Nam

(10) Patent No.: US 7,781,966 B2
(45) Date of Patent: Aug. 24, 2010

(54) ELECTROLUMINESCENT DISPLAY

(75) Inventor: Wi Jin Nam, Busan-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 539 days.

(21) Appl. No.: 11/656,509

(22) Filed: Jan. 23, 2007

(65) Prior Publication Data

US 2008/0012485 A1 Jan. 17, 2008

(30) Foreign Application Priority Data

Jul. 11, 2006 (KR) .................. 10-2006-0064881

(51) Int. Cl.
*H01J 1/62* (2006.01)
(52) U.S. Cl. .................. 313/512; 313/511; 313/504
(58) Field of Classification Search .......... 313/511, 313/504, 512
See application file for complete search history.

(56) References Cited

U.S. PATENT DOCUMENTS

| | | | |
|---|---|---|---|
| 6,013,195 A * | 1/2000 | Corazza et al. ......... 252/181.1 |
| 6,306,352 B1 | 10/2001 | Yoshida et al. |
| 7,342,354 B2 | 3/2008 | Utsunomiya et al. |
| 2003/0170496 A1 | 9/2003 | Hieda et al. |
| 2004/0104672 A1 * | 6/2004 | Shiang et al. .............. 313/506 |
| 2004/0119408 A1 | 6/2004 | Ryu |
| 2004/0135505 A1 * | 7/2004 | Hasegawa et al. .......... 313/553 |
| 2005/0127830 A1 | 6/2005 | Heo et al. |
| 2005/0196711 A1 * | 9/2005 | Shiroguchi et al. .......... 430/330 |

FOREIGN PATENT DOCUMENTS

| | | | |
|---|---|---|---|
| JP | 61145271 A | * | 7/1986 |
| JP | 11-169016 A | | 6/1999 |
| JP | 2001-210466 | | 8/2001 |
| JP | 2001-291579 | | 10/2001 |
| JP | 2004-349152 A | | 12/2004 |
| JP | 2005-157353 A | | 6/2005 |
| KR | 10-2004-0017703 | | 2/2004 |

* cited by examiner

*Primary Examiner*—Nimeshkumar D. Patel
*Assistant Examiner*—Peter R Haderlein
(74) *Attorney, Agent, or Firm*—Lee & Morse, P.C.

(57) ABSTRACT

An EL display, including a substrate having a pixel region and a non-pixel region, at least one light emitting diode disposed on the pixel region of the substrate, a sealant disposed on the non-pixel region of the substrate, an oxygen generating layer, an absorbent layer laminated onto the oxygen generating layer, and a cap adhered to the sealant, such that the at least one light emitting diode, the oxygen generating layer, and the absorbent layer are enclosed between the cap and the substrate.

17 Claims, 2 Drawing Sheets

ELECTROLUMINESCENT DISPLAY

BACKGROUND OF THE INVENTION

1. Field of the Invention

The present invention relates to an electroluminescent display. More particularly, the present invention relates to an electroluminescent display having a structure capable of controlling an amount of oxygen therein, thereby minimizing short circuits between pixels.

2. Description of the Related Art

An electroluminescent (EL) display is a flat display device where voltage may be applied to light emitting layers interposed between two electrodes to combine electrons and holes to form images. An EL display may have superior characteristics as compared to other display devices, such as excellent visibility, light weight, wide viewing angle, high color purity, and relative low power consumption.

A conventional EL display may include a substrate with a pixel region and a non-pixel region, a light emitting diode having two electrodes, i.e., a cathode and an anode, with light-emitting layers therebetween, a cap to seal the light emitting diode on the pixel region of the substrate, and an integrated circuit (IC) component to drive the EL display.

The cap may be attached to the substrate in an inert gas environment, e.g., nitrogen or argon, to form a sealed shell for the light emitting diode and, thereby, minimize contact thereof with air and moisture. Such minimized contact with air and moisture may reduce unfavorable effects of air and moisture on the electric characteristics and emission properties of the light emitting diode and, thereby, enhance the lifespan of the EL display. In particular, the cathode electrode of the light emitting diode may be made of metal and, thereby, be susceptible to oxidation due to contact with moisture. Similarly, if the light emitting layers of the light emitting diode are made of organic material, they may be susceptible to premature deterioration due to contact with hydrogen and oxygen.

During attachment of the cap to the substrate, a small amount of oxygen may be introduced into the interior of the sealed shell of the light emitting diode in order to prevent a short circuit between pixels therein. However, inaccurate control of the oxygen amount inside the sealed shell may be unfavorable. In particular, excess oxygen inside the sealed shell may advance contraction of the pixels. Alternatively, insufficient oxygen inside the sealed shell may cause short circuits between pixels therein. Even if the oxygen amount is appropriate at the time of the EL display formation, its quantity may be reduced overtime and, subsequently, may trigger short circuits.

Accordingly, there remains a need to provide an EL display having a structure capable of controlling the amount of oxygen therein in order to maintain its proper electrical operation.

SUMMARY OF THE INVENTION

The present invention is therefore directed to an electroluminescent (EL) display, which substantially overcomes one or more of the disadvantages of the related art.

It is therefore a feature of an embodiment of the present invention to provide an EL display having an improved structure capable of controlling an amount of oxygen therein.

At least one of the above and other features and advantages of the present invention may be realized by providing an EL display, including a substrate having a pixel region and a non-pixel region, at least one light emitting diode disposed on the pixel region of the substrate, a sealant disposed on the non-pixel region of the substrate, an oxygen generating layer, an absorbent layer laminated onto the oxygen generating layer, and a cap having inner and outer surfaces, wherein the cap may be adhered to the sealant, such that the at least one light emitting diode, the oxygen generating layer, and the absorbent layer may be enclosed between the inner surface of the cap and the substrate. The light emitting diode may be an organic light emitting diode. The cap may be a metal cap.

The oxygen generating layer may be disposed on the inner surface of the metal cap. Additionally, the oxygen generating layer may be capable of absorbing moisture. The oxygen generating layer may include peroxides of alkali metals or peroxides of alkaline earth metals. Further, the oxygen generating layer may include a catalyst, such as manganese dioxide, activated carbon, or catalase.

The EL display of the present invention may also include an absorbent layer. The absorbent layer may be disposed between the inner surface of the metal cap and the oxygen generating layer. Alternatively, the absorbent layer may be adjacent to the oxygen generating layer, such that, for example, the absorbent layer may directly contact a surface of the oxygen generating layer. Additionally, the absorbent layer and the oxygen generating layer may form a laminated structure. The absorbent layer may include calcium or calcium oxide.

The EL display of the present invention may further include a driver IC electrically connected to light emitting diode. Additionally, the electroluminescent display may include a printed circuit board disposed on the outer surface of the metal cap.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
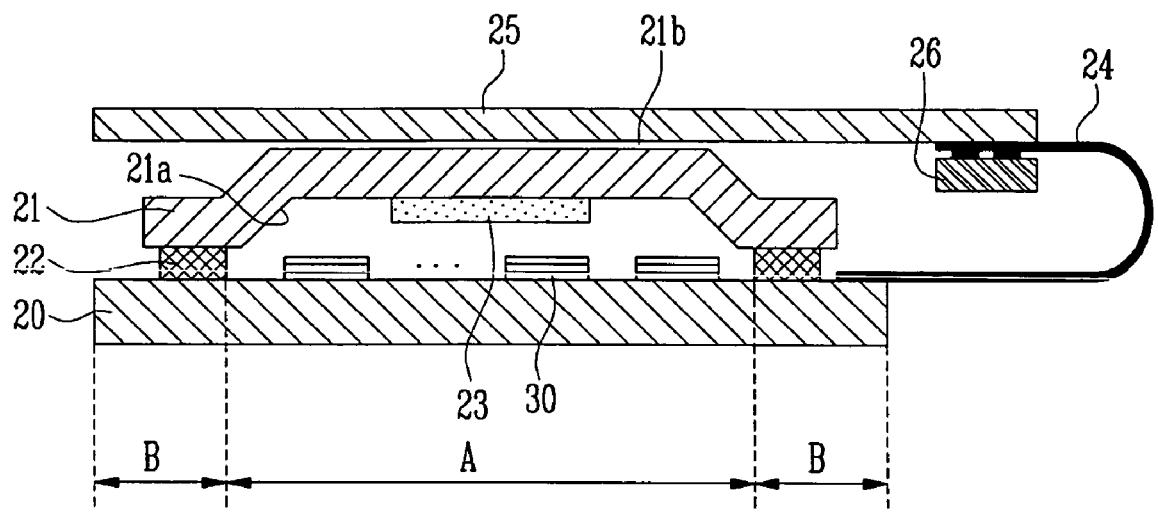
FIG. 1 illustrates a cross-sectional view of an EL display according to an exemplary embodiment of the present invention.

Korean Patent Application No. 10-2006-0064881, filed on Jul. 11, 2006, in the Korean Intellectual Property Office, and entitled, "Organic Light Emitting Display," the disclosure of which is incorporated herein by reference.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element or layer is referred to as being "on" another element, layer or substrate, it can be directly on the other layer or substrate, or intervening layers may also be present. Further, it will be understood that when an element is referred to as being "under" another element, it can be directly under, or one or more intervening elements may also be present. In addition, it will also be understood that when an element is referred to as being "between" two elements, it can be the only element between the two elements, or one or more intervening elements may also be present. Like reference numerals refer to like elements throughout.

An exemplary embodiment of an electroluminescent (EL) display according to the present invention is more fully described below with reference to FIG. 1. As illustrated in FIG. 1, an EL display according to an embodiment of the present invention may include a substrate 20, at least one light emitting diode 30, a metal cap 21 attached to the substrate 20 with at least one sealant 22, and an oxygen generating layer 23.

The substrate 20 may be formed of glass or plastic material. Additionally, the substrate 20 may include a pixel region A and a non-pixel region B, as illustrated in FIG. 1. In particular, the pixel region A may be formed in a center of the substrate 20, such that the at least one light emitting diode 30 may be disposed thereon. The non-pixel region B may be formed around the pixel region A, i.e., a peripheral area of the substrate 20.

The at least one light emitting diode 30 of the EL display according to an embodiment of the present invention may be disposed on the pixel region A of the substrate 20. The light emitting diode 30 may include a pair of electrodes, i.e., a cathode, e.g., made of metal, and an anode, facing each other with at least one light emitting layer interposed therebetween. The light emitting layer of the light emitting diode 30 may include a hole transport layer, an emission layer, and an electron transport layer. The light emitting diode 30 may be an organic light emitting diode (OLED) having at least one organic light emitting layer having an organic emission layer interposed between its electrodes. Accordingly, the EL display may be an organic light emitting display.

Preferably, the EL display of the present invention may include a plurality of light emitting diodes 30 connected to each other in a matrix pattern in the pixel region A of the substrate 20. The plurality of light emitting diodes 30 may be connected between a scan line (not shown) and a data line (not shown) of the EL display.

The metal cap 21 according to an embodiment of the present invention may have an inner surface 21a and an outer surface 21b. Additionally, the metal cap 21 may be formed in a shape of a volumetric vessel, e.g., a cap, a can, or a plate, having a central part and a peripheral edge surrounding the central part, such that the central part may protrude outwardly relative to the peripheral edge, as can be seen in FIG. 1. The metal cap 21 may be formed of any metal known in the art.

The metal cap 21 may be formed to overlap with the substrate 20. In particular, the metal cap 21 may be formed to have a size sufficient to overlap with the pixel region A and parts of the non-pixel region B of the substrate 20 and to attach thereto with at least one sealant 22, e.g., epoxy material. More specifically, the sealant 22 may be coated onto a predetermined part of the peripheral area of the substrate 20, i.e., the non-pixel region B, as illustrated in FIG. 1, such that the peripheral edge of the metal cap 21 may be adhered to the peripheral area of the substrate 20 via the sealant 22.

The inner surface 21a of the metal cap 21 may be attached to the substrate 20, such that a predetermined space may be formed between the central part of the metal cap 21 and the substrate 20 to form a sealed shell and enclose at least one light emitting diode 30 therein. More specifically, the inner surface 21a of the metal cap 21 may be positioned between the metal cap 21 and the substrate 20 such that the light emitting diode 30 may be enclosed therebetween and sealed from contact with external atmospheric elements, such as moisture, oxygen, contaminants, and the like. In this respect, it should be noted that hereinafter terminology such as "sealed shell" may refer to a structure of the metal cap 21 sealed to the substrate 20 as described above.

The oxygen generating layer 23 of the EL display according to an embodiment of the present invention may be disposed inside the sealed shell of the EL display. In particular, the oxygen generating layer 23 may be disposed on the inner surface 21a of the metal cap 21, as illustrated in FIG. 1. Accordingly, when the metal cap 21 and the substrate 20 are sealed together in order to enclose the at least one light emitting diode 30 therebetween, the oxygen generating layer 23 may be enclosed between the metal cap 21 and the substrate 20, as well.

The oxygen generating layer 23 may contain at least one oxygen generation material. Preferably, the oxygen generating layer 23 may include an oxygen generation material that is capable of generating oxygen by absorbing moisture, e.g., peroxides of alkali metals or peroxides of alkaline earth metals, in order to simultaneously minimize any moisture penetration and maintain a desired amount of oxygen therein. Additionally, any one of manganese dioxide, activated carbon, or catalase may be added to the oxygen generating layer 23 to catalyze the decomposition rate of the peroxides.

The oxygen generation material employed in the oxygen generating layer 23, i.e., a peroxide material having a desirable decomposition rate, the catalyst particle size, i.e. particle diameter, and the size of the oxygen generating layer 23, i.e., a surface area of the oxygen generating layer 23 that is in contact with an interior of the sealed shell, may be determined and adjusted by one of ordinary skill in the art with respect to the manufacturing specifications of the EL display and the desired amount of oxygen therein, i.e., amount of oxygen in the sealed shell.

As illustrated in FIG. 1, the EL display according to an embodiment of the present invention may further include a driver integrated circuit (IC) 26, a printed circuit board (PCB) 25, and a tape carrier package (TCP) 24. The PCB 25 may be affixed to an outer surface 21b of the metal cap 21 to supply electric signals to the light emitting diodes 30 of the EL display. The TCP 24 may be coupled between the PCB 25 and the substrate 20, as illustrated in FIG. 1, to provide signal wirings for signal transmission between the PCB 25 and the at least one light emitting diode 30. The driver IC 26 may be in communication with the PCB 25 and the TCP 24. The driver IC 26 may drive the at least one organic light emitting diode 30 by transmitting data and scan signals thereto via data and scan lines, respectively.

Figure 2:
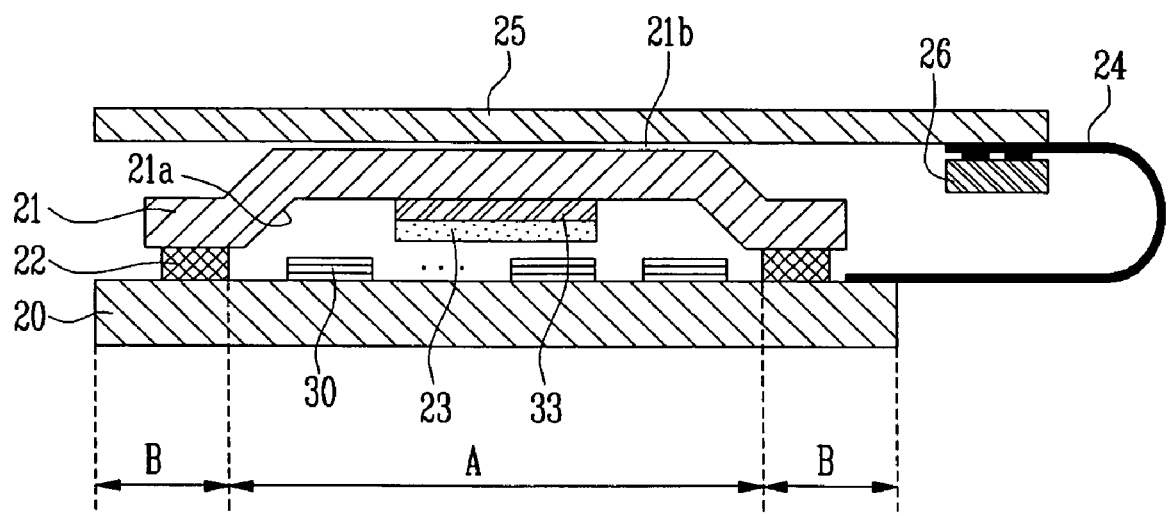
FIG. 2 illustrates a cross-sectional view of an EL display according to another exemplary embodiment of the present invention.

Another exemplary embodiment of the present invention is described with respect FIG. 2. In particular, as illustrated in FIG. 2, an EL display according to an embodiment of the present invention may include a substrate 20, at least one light emitting diode 30, a metal cap 21 attached to the substrate 20 with at least one sealant 22, an oxygen generating layer 23, and an absorbent layer 33. It should be noted that the same elements may be included in the embodiments illustrated in FIGS. 1-2. Accordingly, details and descriptions that may be found in both embodiments illustrated in FIGS. 1-2 will not be repeated herein.

The absorbent layer 33 of the EL display according to an embodiment of the present invention may be disposed inside the sealed shell of the EL display in a form of a film or powder. In particular, the absorbent layer 33 may be disposed on the inner surface 21a of the metal cap 21, as illustrated in FIG. 2, to minimize penetration of moisture, oxygen, and hydrogen into the sealed shell. The absorbent layer 33 may be formed of any hygroscopic material known in the art, such as calcium or calcium oxide.

When the absorbent layer 33 is employed in the EL display according to an embodiment of the present invention, the oxygen generating layer 23 may be disposed inside the sealed shell of the EL display in any suitable configuration as may be determined by one of ordinary skill in the art. For example, the oxygen generating layer 23 and the absorbent layer 33 may be formed to be in communication with each other by a lamination method. More specifically, the absorbent layer 33 may be positioned between the oxygen generating layer 23 and the inner surface 21a of the metal cap 21. However, other configurations are not excluded from the scope of the present invention.

Without intending to be bound by theory, it is believed that disposing the absorbent layer 33 in addition to the oxygen generating layer 23 on the inner surface 21a of the metal cap 21, i.e., inside the sealed shell, may improve the oxygen generation efficiency therein. In particular, since a separate layer for absorbing moisture, i.e., the absorbent layer 33, may be disposed in the EL display, the oxygen generating layer 23 may generate oxygen and maintain a predetermined amount thereof inside the sealed shell without absorbing moisture. Minimized moisture absorption by the oxygen generating layer 23 is believed to decrease its deterioration rate, thereby providing for improved EL display operation and lifespan.

Figure 3:
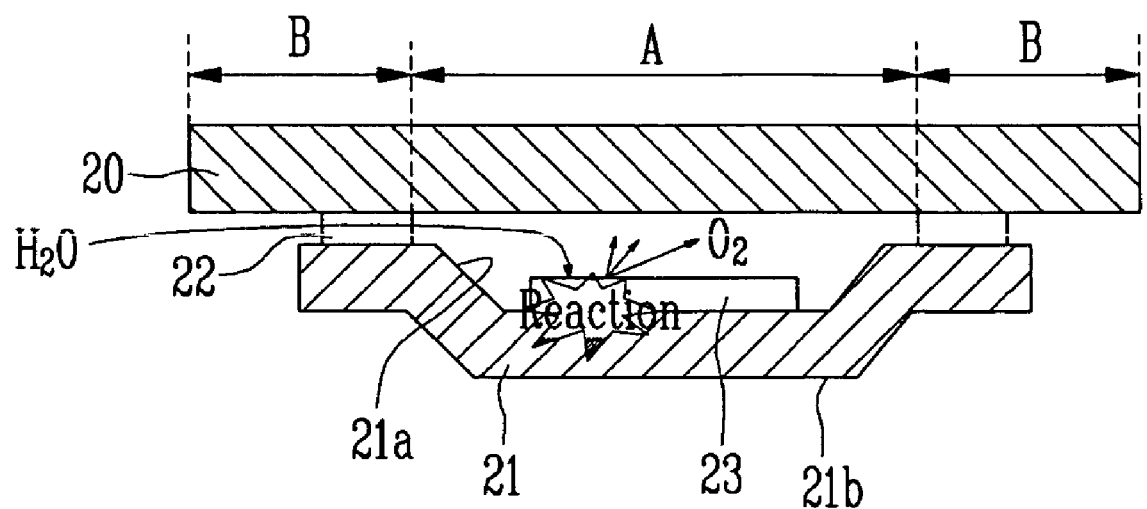
FIG. 3 illustrates oxygen generation in the EL displays of FIGS. 1-2.

An exemplary embodiment of oxygen generating layer 23 described previously with respect to FIGS. 1-2 is described in more detail with respect to FIG. 3. In particular, as illustrated in FIG. 3, after attachment of the metal cap 21 to the substrate 20 in an inert gas environment, e.g., nitrogen, a small amount of oxygen may be present therein. Any potential moisture penetration into the interior of the sealed shell may trigger a chemical reaction between water particles and the oxygen generation material of the oxygen generating layer 23, as illustrated in FIG. 3. The chemical reaction may reduce the amount of water and produce oxygen instead. Accordingly, even though the small amount of oxygen introduced into the sealed shell during its formation may be reduced overtime, the oxygen generating layer 23 may generate additional oxygen in order to minimize potential short circuits between pixels.

Exemplary embodiments of the present invention have been disclosed herein, and although specific terms are employed, they are used and are to be interpreted in a generic and descriptive sense only and not for purpose of limitation. For example, while the cap has been referred to as being metal, any material providing a sufficient barrier may be employed. Accordingly, it will be understood by those of ordinary skill in the art that various changes in form and details may be made without departing from the spirit and scope of the present invention as set forth in the following claims.

What is claimed is:

1. An electroluminescent display, comprising:
    a substrate having a pixel region and a non-pixel region;
    at least one light emitting diode disposed on the pixel region of the substrate;
    a sealant disposed on the non-pixel region of the substrate;
    an oxygen generating layer;
    an absorbent layer laminated to the oxygen generating layer; and
    a cap having inner and outer surfaces, and adhered to the sealant, wherein the at least one light emitting diode, oxygen generating layer, and absorbent layer are enclosed between the inner surface of the cap and the substrate.

2. The electroluminescent display as claimed in claim 1, wherein the oxygen generating layer is disposed on the inner surface of the cap.

3. The electroluminescent display as claimed in claim 1, wherein the oxygen generating layer is capable of absorbing moisture.

4. The electroluminescent display as claimed in claim 1, wherein the oxygen generating layer comprises peroxides of alkali metals or peroxides of alkaline earth metals.

5. The electroluminescent display as claimed in claim 4, wherein the oxygen generating layer further comprises a catalyst.

6. The electroluminescent display as claimed in claim 5, wherein the catalyst is manganese dioxide, activated carbon, or catalase.

7. The electroluminescent display as claimed in claim 1, wherein the absorbent layer is disposed between the inner surface of the cap and the oxygen generating layer.

8. The electroluminescent display as claimed in claim 1, wherein the absorbent layer is adjacent to the oxygen generating layer.

9. The electroluminescent display as claimed in claim 1, wherein the absorbent layer includes calcium or calcium oxide.

10. The electroluminescent display as claimed in claim 1, further comprising a driver integrated circuit (IC) electrically connected to the at least one light emitting diode.

11. The electroluminescent display as claimed in claim 1, further comprising a printed circuit board disposed on the outer surface of the cap.

12. The electroluminescent display as claimed in claim 1, wherein the at least one light emitting diode is an organic light emitting diode.

13. The electroluminescent display as claimed in claim 1, wherein the cap is a metal cap.

14. The electroluminescent display as claimed in claim 1, wherein the oxygen generating layer and the absorbent layer are two distinct layers having a single contact plane therebetween.

15. The electroluminescent display as claimed in claim 1, wherein at least one of the oxygen generating layer and the absorbent layer is directly on the inner surface of the cap.

16. The electroluminescent display as claimed in claim 15, wherein the absorbent layer is directly on the inner surface of the cap, the absorbent layer being directly between the inner surface of the cap and the oxygen generating layer.

17. The electroluminescent display as claimed in claim 1, wherein the oxygen generating layer and the absorbent layer extend along the inner surface of the cap in parallel to the substrate, the oxygen generating layer and the absorbent layer completely overlapping each other.

* * * * *